(12) United States Patent
Vasquez

(10) Patent No.: US 6,521,512 B2
(45) Date of Patent: Feb. 18, 2003

(54) METHOD FOR FABRICATING A THIN, FREE-STANDING SEMICONDUCTOR DEVICE LAYER AND FOR MAKING A THREE-DIMENSIONALLY INTEGRATED CIRCUIT

(75) Inventor: Barbara Vasquez, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/970,977

(22) Filed: Oct. 4, 2001

(65) Prior Publication Data

US 2002/0048955 A1 Apr. 25, 2002

(30) Foreign Application Priority Data

Oct. 4, 2000 (EP) .............................. 00121689

(51) Int. Cl.$^7$ ............................... H01L 21/46
(52) U.S. Cl. ................... 438/459; 438/977; 438/751
(58) Field of Search .................. 438/977, 459, 438/745, 689, 751, 650–669, 618, 750

(56) References Cited

U.S. PATENT DOCUMENTS

| | | |
|---|---|---|
| 5,563,084 A | 10/1996 | Ramm et al. |
| 5,766,984 A * | 6/1998 | Ramm et al. ............... 438/109 |
| 5,851,894 A | 12/1998 | Ramm |
| 5,989,974 A * | 11/1999 | Yamada et al. ............. 438/407 |

FOREIGN PATENT DOCUMENTS

| | | |
|---|---|---|
| DE | 198 13 239 C1 | 12/1999 |
| DE | 198 46 232 A1 | 3/2000 |
| DE | 198 49 586 C1 | 5/2000 |
| DE | 199 04 751 C1 | 7/2000 |
| EP | 0 531 723 A1 | 3/1993 |
| EP | 0 926 726 A1 | 6/1999 |

OTHER PUBLICATIONS

Kurino, H. et al.: "Intelligent Image Sensor Chip with Three Dimensional Structure", IEEE, dated 1999.

Siniaguine, Oleg: "Atmospheric Downstream Plasma Etching of Si Wafers", Tru–Si Technologies Inc., dated Oct. 18, 1998.

Ramm et al.: "Three Dimensional Metallization for Vertically Integrated Circuits (Invited Lecture)", Elsevier Science B.V., dated 1997, pp. 41–47.

* cited by examiner

*Primary Examiner*—Chandra Chaudhari
*Assistant Examiner*—David Hogans
(74) *Attorney, Agent, or Firm*—Laurence A. Greenberg; Werner H. Stemer; Ralph E. Locher

(57) ABSTRACT

In a method for fabricating a silicon-on-insulation wafer having fully processed devices in its upper-most silicon layer, the wafer is reduced in thickness from a surface opposite to the device layer surface by performing a first etching step of etching the semiconductor substrate to the insulation layer, so that the insulation layer functions as an etch stop layer, and a second etching step of etching the insulation layer to the semiconductor device layer, so that the semiconductor device layer functions as an etch stop layer. The semiconductor device layer is then separated into individual chips for fabricating a three-dimensionally integrated circuit thereof.

16 Claims, 3 Drawing Sheets

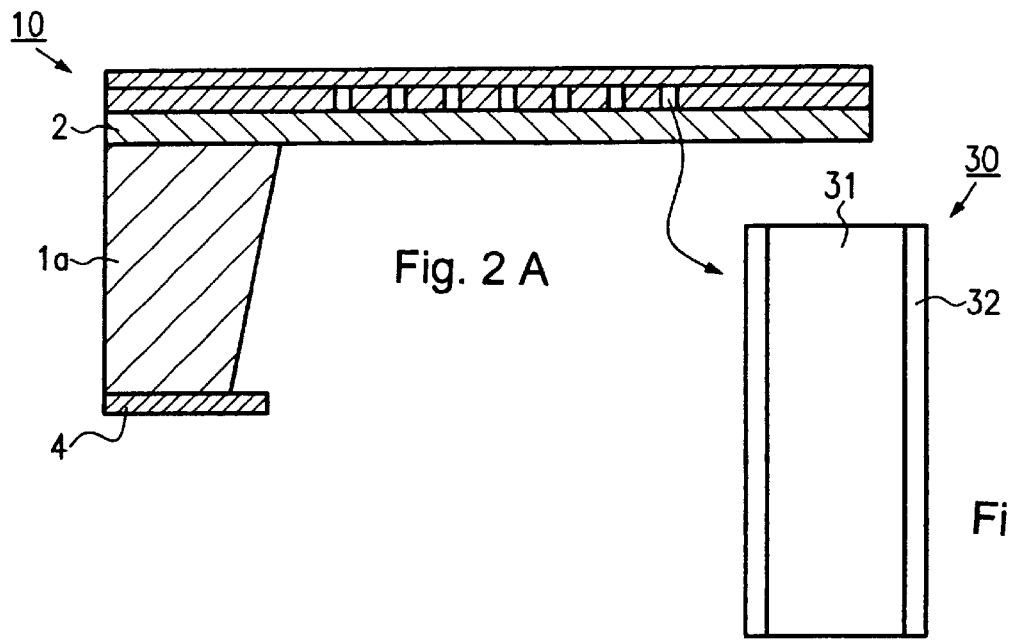
Fig. 2 A
Fig. 2 B
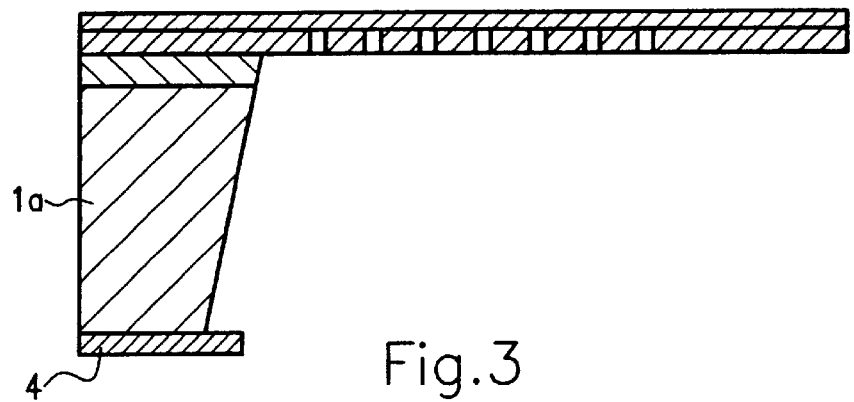
Fig. 3
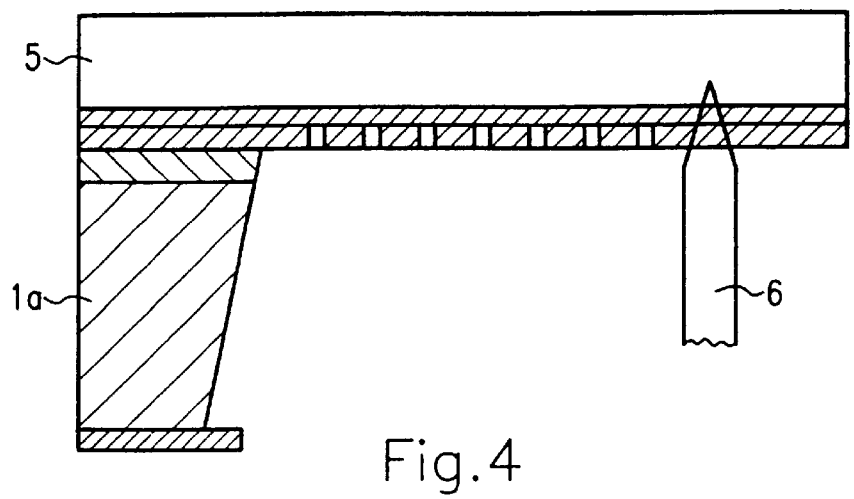
Fig. 4

METHOD FOR FABRICATING A THIN, FREE-STANDING SEMICONDUCTOR DEVICE LAYER AND FOR MAKING A THREE-DIMENSIONALLY INTEGRATED CIRCUIT

BACKGROUND OF THE INVENTION

Field of the Invention

The present invention relates in general to a method of fabricating three-dimensionally integrated circuits. In particular, the invention relates to a method of fabricating a thin, free-standing semiconductor device layer, in which a plurality of via holes extend from the devices and/or from metallisation layers to a surface of the thin, free-standing semiconductor device layer. The free-standing semiconductor device layer and individual chips obtained therefrom are then used to fabricate a three-dimensionally integrated circuit.

Three-dimensional integration, i.e. vertical interconnection of devices fabricated by planar technology is becoming increasingly important as higher package densities and switching rates may be obtained as compared to two-dimensional systems. Current methods available in practice or in the literature for vertical interconnection for very large scale integrated (VLSI) devices are, however, relatively complex. The VLSI chips must have some through-wafer structures for vertical (backside) interconnect and backside contact and must be thinned to an appropriate thickness for good electrical performance (low vertical interconnect resistance) and good thermal control (minimal thermal mass of the stacked silicon). The final thickness of the vertically integrated chips is also important in end products where total IC volume and not just density in x and y is a key differentiator such as in hand held and mobile applications.

In a first step of a method for making a three-dimensionally integrated circuit, it is necessary to fabricate thin chips containing fully processed semiconductor devices and interconnection openings leading from the devices to one surface of the thin chips. There are methods in the literature or available from vendors for thinning wafers after full integration. For example, the methods as proposed by the company Tru-Si Technologies (see literature and advertisements from Tru-Si Technologies, an equipment vendor) involve grinding and a special type of plasma etch for the thinning of the entire wafer. The special plasma etch has a relatively slow etch rate and the equipment is relatively expensive.

Finally, wafers thinner than 300 $\mu$m (for 200 mm wafers) start to present major handling challenges due to bowing. However, in the three-dimensionally stacked chip application, the final thickness should be under 100 $\mu$m and preferably no thicker than required by the depths of the junctions plus the required thickness of underlying substrate required for the active circuits to be stacked. For example, for a 64M DRAM with deep trench capacitors and with metal-, metal silicide- or doped polysilicon-filled trenches as a vertical interconnect, the thickness of the finished chip for 3-D integration should be in the range of 15–20 $\mu$m. The thickness of the chip determines the length of the vertical interconnect. Thicker chips therefore result in increased difficulty in processing and filling the interconnect via holes and an increased resistance of the vertical interconnects. However, for VLSI devices without these trench capacitors or deep junctions, the chips could be thinner and the vertical interconnects easier to be processed.

It is quite difficult to thin a starting wafer from its initially full thickness (approximately 750 $\mu$m for 200 mm wafers) to <100 $\mu$m with good uniformity and without damage. U.S. Pat. No. 5,563,084, which is incorporated herein by reference, discloses a method of making a three-dimensional integrated circuit. The method includes providing a first substrate that at a first surface is provided with at least one fully processed device plane containing a plurality of independent devices or circuits in a side-by-side configuration, wherein the devices or circuits of a plurality of device planes form a device stack. A second substrate is provided which at one surface is provided with at least one fully processed device plane containing a plurality of independent devices or circuits in a side-by-side configuration, wherein the devices and circuits of a plurality of device planes form a device stack. The devices, the device stacks or the circuits having been tested to distinguish between functioning and defective devices, device stacks or circuits. One surface of the second substrate is connected to an auxiliary substrate. The second substrate is thinned or reduced from a surface opposite the main surface. The auxiliary substrate and the devices connected thereto are separated into individual chips respectively containing functioning or defective devices, device stacks or circuits. The chips containing the functioning devices, the device stacks or the circuits are aligned and attached in a side-by-side relationship on the first side of the first substrate and the auxiliary substrate is then removed. The moats created between individual chips as a result of their aligning and attaching are planarized and simultaneously with, or subsequently to, the attaching of the chips, providing electrical contacts between the devices, the device stacks or the circuits of the attached chips and the devices, device stacks and circuits of the first substrate. In a preferred embodiment, the second device substrate is shown to be made from a normal silicon wafer. It is also disclosed that the second substrate can be made of a silicon-on-insulator (SOI) substrate. In this case, it is mentioned that when thinning or reducing the second substrate instead of thinning the upper substrate down to close to the device layers, the substrate below the oxide layer of the SOI substrate may be removed.

A similar method is disclosed in German Patent DE 198 13 239 C1. It also states that the substrate to be reduced and thinned may be an SOI substrate. Moreover, it teaches that before thinning of the substrate the via holes should be formed through the oxide layer and the thinning of the substrate should be terminated when the oxide layer is reached.

The methods as disclosed in the two aforementioned patents are disadvantageous as the via holes and thus the vertical interconnections are relatively long as they must be formed through the device layer and the oxide layer formed under the device layer. It is therefore difficult to fabricate vertical interconnects which contain a sufficiently low resistance to electrically connect devices in adjacent device planes. Moreover, due to the length and aspect ratio of the via holes in the state of the art, it is difficult to deposit the electrically conducting material in a reliable manner.

SUMMARY OF THE INVENTION

It is accordingly an object of the invention to provide a method for fabricating a thin, free-standing semiconductor device layer and for making a three-dimensionally integrated circuit which overcomes the above-mentioned disadvantages of the prior art method devices of this general type.

With the foregoing and other objects in view there is provided, in accordance with the invention, a method for fabricating a thin, free-standing device semiconductor layer. The method includes providing a semiconductor specimen having a semiconductor substrate, a buried insulation layer formed in the semiconductor substrate, and a semiconductor device layer disposed on the buried insulation layer and defining a first surface of the semiconductor specimen. The semiconductor device layer has a plurality of independent devices and metallization layers disposed therein. The semiconductor substrate extends from the buried insulation layer to a second surface of the semiconductor specimen opposite the first surface. The semiconductor device layer has a plurality of via holes formed therein and each extends to the buried insulation layer from one of the independent devices and the metallization layers. A thickness of the semiconductor substrate is reduced from the second surface by performing the steps of etching the semiconductor substrate down to the buried insulation layer with the buried insulation layer functioning as an etch stop layer; and etching the buried insulation layer down to the semiconductor device layer with the semiconductor device layer functioning as a further etch stop layer.

It is therefore an object of the present invention to provide a thin, free-standing semiconductor device layer containing via holes or vertical interconnects. The method is capable of providing device layers with a reduced thickness as compared to the state of the art and also of precisely controlling the thickness of the device layer. In particular, the thin, free-standing semiconductor device layer is formed from a semiconductor specimen provided at one of its surfaces with the semiconductor device layer having the plurality of independent devices disposed therein. The buried insulation layer are disposed below the semiconductor device layer. The semiconductor substrate extends from the buried insulation layer to a surface opposite the one surface and a plurality of via holes extend from the devices and/or from metallisation layers to the buried insulation layer. The via holes may be isolated laterally from the substrate layer by a thin conformal layer of a dielectric material and are filled with an electrically conducting material. In this manner, the thickness of the free-standing semiconductor device layer can be controlled in a precise and reliable manner. In particular, it is intended by the method of the invention that the length of the via holes are reduced, so that the vertical interconnects have a low resistivity and may be processed in an easy and reliable manner. It is a further object of the present invention to provide a method of making a three-dimensionally integrated circuit by making use of thin semiconductor device layers as obtained from the inventive method.

An important teaching of the present invention therefore is that when using a so-called SOI (silicon-on-insulator) substrate or, in a more general term, a semiconductor-on-insulator substrate, the via holes should be formed only until the insulation layer, in particular the oxide layer, and to remove the insulation layer when reducing and thinning the substrate. The removal of the insulation layer and the use of the insulation layer and the device layer as etch stop layers in the two etching steps allows the fabrication of a thin, free-standing semiconductor device layer with precise control of thickness. Also the length of the via holes and thus the length of the vertical interconnects can be limited to the thickness of the semiconductor device layer, so that the via holes can be easily filled with electrically conducting material and vertical interconnects with sufficiently low resistivity can be obtained.

The semiconductor specimen, in particular the SOI substrate, as used in the inventive method can be prepared by different methods. According to one method the buried insulation layer is generated by implanting ions of the insulation layer material into the semiconductor specimen. In another method, the semiconductor specimen is fabricated by the well-known wafer bonding, wherein two semiconductor wafers having insulation layers on one of their respective surfaces are provided and bonded together at their respective insulation layers and the semiconductor layer of one of the wafers is thinned to become the said semiconductor device layer. After-wards devices are processed in the semiconductor device layer.

In order to make the insulation layer and the semiconductor device layer function as etch stop layers, the etching conditions are set such that etching selectivities of more than 10, in particular 20 to 50, between the respective material to be etched and the respective etch stop layer material are set. For example, the etchant of the semiconductor material, in particular in case of silicon, is formed of KOH or TMAH. The etchant of the buried insulation layer, in particular in case of $SiO_2$, may then be formed of HF. After removing the $SiO_2$, a final selective silicon etch can be used to recess the device layer silicon so that the conductor filled vias form raised features on the backside for subsequent contact in the stacking assembly process.

Before performing either of the etching steps, a mechanical grinding step to partially thin the semiconductor substrate can be performed.

When reducing the thickness of the semiconductor substrate, a portion of the semiconductor substrate, in particular a ring like edge portion may be masked by a masking layer and not reduced in thickness. This avoids the necessity of connecting an auxiliary substrate to the surface at the side of the device layer as disclosed in the above mentioned U.S. Pat. No. 5,563,084. However, in case that the semiconductor substrate should be reduced on its entire diameter an auxiliary substrate must be connected to the surface of the semiconductor specimen for stability and handling reasons.

Alternatively, the device wafer could be partially sawn from the front: side, mounted on tape on the dicing ring and subsequently processed through wet etches for bulk silicon and buried oxide layer removal. The materials of the ring and tape must withstand the chemical etches. In this way, following the oxide etch the thinned chips are ready for removing from the tape and attaching to the other substrate to form the 3-D assembly.

In accordance with an added mode of the invention, there are the steps of filling the via holes with an electrically conducting material and coating walls of the via holes with an insulating layer before filling the via holes.

In accordance with another mode of the invention, there is the step of opening the insulating layer at a bottom of the via holes anisotropically before filling in the via holes with the electrically conducting material.

The present invention also discloses a method of making a three-dimensionally integrated circuit, including the steps of providing a first substrate provided at a surface thereof with a first device layer having a plurality of independent devices (step A), fabricating a thin, free-standing semiconductor device layer according to the above described inventive method with a semiconductor specimen as a second substrate (step B), separating the devices in the semiconductor device layer of the second substrate into individual chips (step C), and mounting the chips on the first surface of the first substrate (step D). The electrical interconnections between the devices of the mounted chips and the devices in the first device layer can be formed afterwards by depositing an electrically conducting material in the via holes. However, this can also be accomplished before the stacking of the chips, for example immediately after forming of the via holes.

This method is a chip to wafer stacking method. With respect to details of steps A to D reference is made herewith to the state of the art, in particular to the U.S. Pat. No. 5,563,084 and the description given therein from column 3, line 46 to column 4, line 67, which is incorporated herein by reference.

A further method of making a three-dimensionally integrated circuit, which may be called chip to chip stacking method, includes the steps of: fabricating a first thin, free-standing semiconductor device layer according to the above described inventive method with a first semiconductor specimen as the substrate (step A), separating the devices in the semiconductor device layer of the first semiconductor specimen into individual first chips (step B), fabricating a second thin, free-standing semiconductor device layer according to the above described inventive method with a second semiconductor specimen as the substrate (step C), separating the devices in the semiconductor device layer of the second semiconductor specimen into individual second chips (Step D), mounting the first chips on the second chips (step E), and, if necessary, stacking further chips on the first or second chips until a desired stack height is achieved (step F).

Other features which are considered as characteristic for the invention are set forth in the appended claims.

Although the invention is illustrated and described herein as embodied in a method for fabricating a thin, free-standing semiconductor device layer and for making a threes dimensionally integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A is a sectional view of the SOI wafer after a first etching step of etching a silicon substrate under the oxide layer and an enlarged view of a vertical interconnection;

FIG. 2B is a sectional view of a conducting material with a dielectric layer;

FIG. 3 is a sectional view of the SOI wafer after a second etching step of etching the oxide layer under the device layer; and FIG. 4 is a sectional view showing the step of mounting a tape on the upper surface of the device layer for the purpose of cutting it into individual chips.

DESCRIPTION OF THE PREFERRED EMBODIMENTS

Figure 1A:
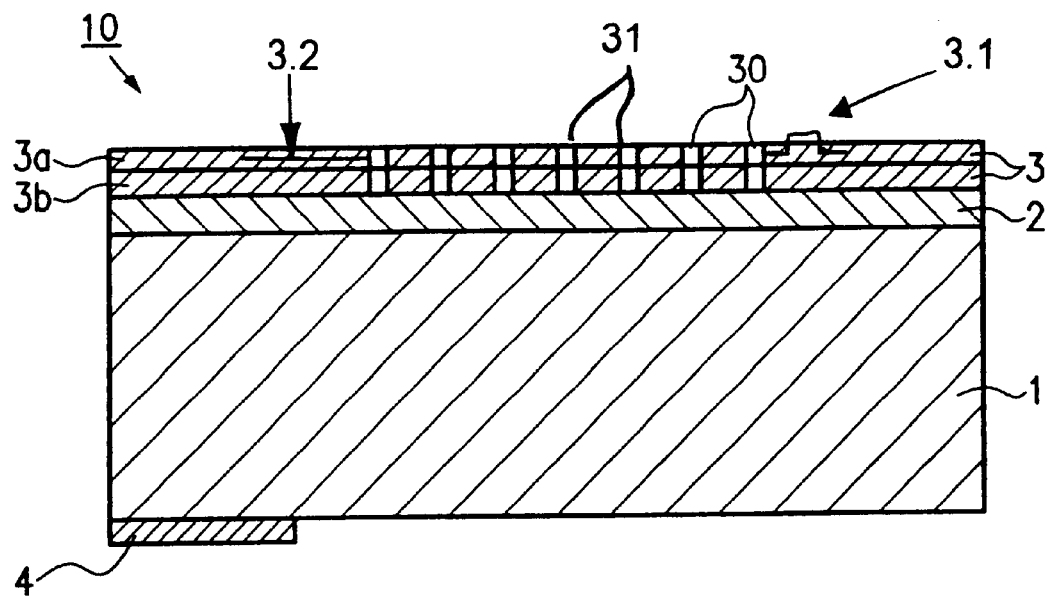
FIGS. 1A and 1B are diagrammatic, sectional views of a SOI wafer having a fully processed device layer and via holes formed through the device layer to an oxide layer, FIG. 1A being a cross-sectional view and FIG. 1B being a sectional view from a perspective of the bottom according to the invention.
Figure 1B:
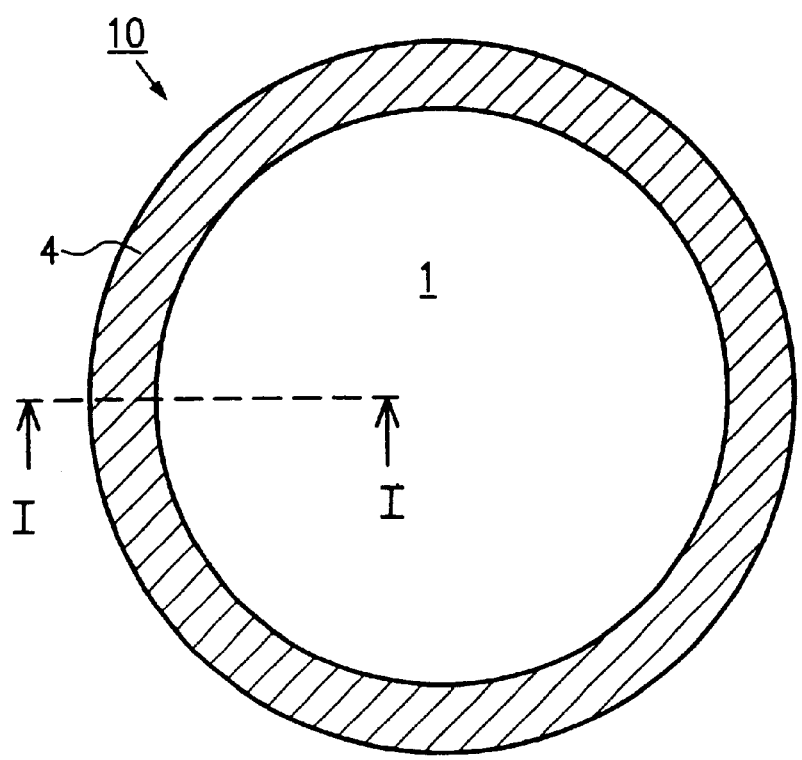
Figure 1:
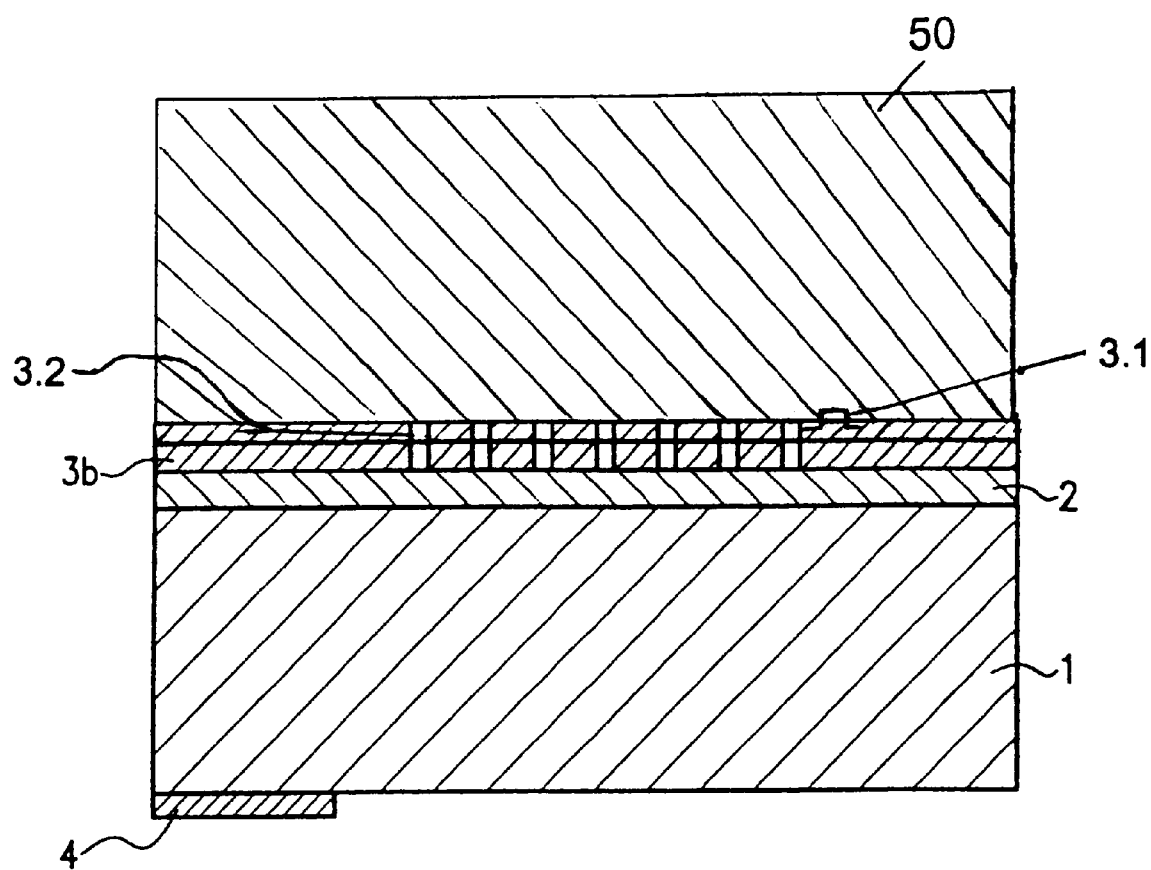
FIG. 1C is a cross-sectional view similar to FIG. 1A, showing the connecting of the specimen to an auxiliary substrate.

Referring now to the figures of the drawing in detail and first, particularly, to FIGS. 1A and 1B thereof, there is shown a silicon-on-insulator (SOI) substrate as used in the embodiment of the present invention. The SOI substrate is in general formed of an upper crystalline silicon layer 3, a buried oxide layer 2 and a thick silicon substrate 1. The buried oxide layer 2 can be generated by implanting oxygen ions of well-defined ion energy. The ion energy determines a range of penetration of the ions into the silicon material and thus a thickness of the upper crystalline layer 3. Another way of producing the SOI substrate is by use of the wafer bonding method, wherein two silicon wafers having a thermally grown oxide on one of their respective top surfaces are bonded together at their oxide layers and afterwards the semiconductor substrate of one of the wafers is thinned to become the crystalline silicon layer 3 as shown in FIG. 1A. In this case, one obtains a sharp edge between the crystalline silicon layer 3 and the oxide layer 2.

FIG. 1B shows a bottom view of the SOI wafer as shown in FIG. 1A. On the back surface of the SOI wafer an etch masking layer 4 is formed on a ring like edge portion of the backside of the SOI substrate for the purpose of sparing a zone of full thickness silicon in the etching steps for mechanical stability reasons. The area of the cross section of FIG. 1A is indicated by line I-I in FIG. 1B.

The upper crystalline silicon layer 3 may be subdivided in an upper device and metallization layer 3a, in which a plurality of semiconductor devices like MOS-transistors 3.1 and the like are formed in a side-by-side configuration and connected to metallization layers 3.2. From these devices 3.1 and/or from the metallization layers 3.2 via holes are formed in such a way that they extend in a vertical direction until the upper surface of the buried oxide layer 2, wherein the buried oxide layer serves as an etch stop for the via hole etching step. The via holes can be etched before, during or after the formation of the devices 3.1 and their metallisation layers 3.2. The via holes are then filled with an electrically conducting material 31 like a metal, a metal silicide or doped polysilicon to become vertical interconnects 30. For isolating the electrically conducting material 31 from the silicon material of a layer 3b, a dielectric layer 32 is applied to the walls of the via holes before filling in with the conducting material 31 (see FIG. 2B).

FIG. 1C is a cross-sectional view similar to FIG. 1A, showing the connecting of the specimen 10 to an auxiliary substrate 50 before reducing the thickness of the silicon substrate 1.

A SOI wafer 10 is shown in FIG. 2A after the first etching step of etching the silicon substrate 1 in the area which is not masked by the masking layer 4. In the first etching step the oxide layer 2 functions as an etch stop layer. For this purpose, an etchant exhibiting high etching selectivity between Si and $SiO_2$ must be selected. With etchants like KOH or TMAH etching selectivities of about 20:1 can be achieved. It will be understood that the configuration of the etch chamber is such that only the backside of the wafer 10 is exposed to the etchant. Conversely, the front side of the device wafer may be coated and protected by a sacrificial layer of an etch-resistant material.

Afterwards the oxide layer 2 is etched as depicted in FIG. 3. In this case, a wet etchant having a high etching selectivity of $SiO_2$ with respect to silicon has to be used. For example, HF can be used as the etchant for the second etching step. The second etching step thus creates a thin silicon device layer having the required thickness and is surrounded by an irregularly shaped ring having a full thickness of silicon under the masking layer 4. The shaped ring provides mechanical stability to the thinned wafer and also a handling region for handling the thinned silicon wafer. After the second etching step the bottoms of the vertical interconnects 30 are exposed. In the case where the dielectric layer 32 has been opened at the bottom of the vertical interconnect structure before the depositing conductive material 31, the oxide etch must also be selective to the conductive material 31.

The wafer 10 is then mounted upside-down on a conventional tape 5 as shown in FIG. 4. The tape 5 may be attached to a non-illustrated frame. With a conventional saw blade 6 the device layer 3 can then be cut into individual device chips. The patterning of the vertical interconnects 30 can include fiducial marks to align the wafer saw from the backside of the device layer 3, on which the devices are located. After the wafer slicing step, the individual device chips are then picked from the tape 5 by their backside surface for subsequent three-dimensional assembly.

In the embodiment as depicted in FIGS. 1 to 4 the vertical interconnects 30 are formed immediately after the etching of the via holes through the device layer 3 by forming the dielectric layer 32 and filling the via holes with the electrically conducting material 31 all of which occurs before the multilayer metallisation (MLM) is built on the device. This "middle of line" integration supports better design efficiency because the chip interconnects are connected by vias to the MLM. However, the present invention could also be integrated with vertical interconnect formation as disclosed in U.S. Pat. No. 5,563,084, wherein the chips are stacked after thinning and vertical interconnect formation is accomplished after three-dimensional assembly of the device chips. Finally, the through-wafer interconnect could be formed in the starting substrate before device formation, but then the conductive fill material 31 must be compatible with the high temperature processing used in "front end of line" semiconductor integration. This process might require infrared imaging through the silicon membrane if it is not transparent enough to use visible light to align the saw blade 6 to the metal patterns on the front side of the device layer 3.

In a chip-to-wafer stacking method for three-dimensionally integration the thus obtained thin chips may be mounted on a substrate provided at a surface thereof with a device layer having a plurality of independent devices as was in principle disclosed in the U.S. Pat. No. 5,563,084.

However, it is also possible that the process of fabricating thin chips is repeated so that from the first process a first set of thin chips is obtained and from the second process a second set of thin chips is obtained and the first chips are mounted on the second chips. Such a method of making a three-dimensionally integrated circuit may be called a chip-to-chip stacking method.

I claim:

1. A method for fabricating a thin, free-standing semiconductor layer, which comprises the steps of:

providing a semiconductor specimen having a semiconductor substrate, a buried insulation layer formed in the semiconductor substrate, and a semiconductor device layer disposed on the buried insulation layer and defining a first surface of the semiconductor specimen, the semiconductor device layer having a plurality of independent devices and metallization layers disposed therein, the semiconductor substrate extending from the buried insulation layer to a second surface of the semiconductor specimen opposite the first surface, the semiconductor device layer having a plurality of via holes formed therein and each extending to the buried insulation layer from one of the independent devices and the metallization layers; and reducing a thickness of the semiconductor substrate from the second surface by performing the steps of:
etching the semiconductor substrate down to the buried insulation layer with the buried insulation layer functioning as an etch stop layer; and
etching the buried insulation layer down to the semiconductor device layer with the semiconductor device layer functioning as a further etch stop layer.

2. The method according to claim 1, which comprises forming the buried insulation layer by implanting ions into the semiconductor specimen.

3. The method according to claim 1, which comprises:
fabricating the semiconductor specimen by providing two semiconductor wafers each having an insulation layer on one of their respective surfaces and bonding them together at the respective surfaces having the insulation layer; and
thinning one of the semiconductor wafers at one side resulting in a thinned wafer functioning as the semiconductor device layer.

4. The method according to claim 1, which comprises performing the etching steps such that etching selectivities of more than 10, between a respective material to be etched and a respective etch stop layer material, are set.

5. The method according to claim 1, which comprises performing a mechanical grinding step to partially thin the semiconductor substrate before performing either of the etching steps.

6. The method according to claim 1, which comprises using an etchant for etching the semiconductor substrate.

7. The method according to claim 1, which comprises using HF as an etchant for etching the buried insulation layer.

8. The method according to claim 1, which comprises performing the reducing step such that a ring shaped edge portion of the semiconductor substrate is not reduced in thickness by applying a masking layer to the ring shaped edge portion on the second surface of the semiconductor substrate.

9. The method according to claim 1, which comprises connecting a surface of the semiconductor specimen to an auxiliary substrate before performing the reducing step.

10. The method according to claim 1, which comprises mounting one of the first surface and the second surface of the semiconductor specimen on a tape after completing the reducing step.

11. The method according to claim 1, which comprises filling the via holes with an electrically conducting material.

12. The method according to claim 11, which comprises coating walls of the via holes with an insulating layer before performing the step of filling the via holes.

13. The method according to claim 12, which comprises opening the insulating layer at a bottom of the via holes anisotropically before filling in the via holes with the electrically conducting material.

14. The method according to claim 1, which comprises performing the etching steps with an etching selectivity of about 20, between a respective material to be etched and a respective etch stop layer material.

15. The method according to claim 1, which comprises using an etchant for etching the semiconductor substrate from the group consisting of KOH and TMAH.

16. The method according to claim 12, which comprises using a material selected from the group consisting of silicon dioxide, oxynitride and siliconnitride as an insulating material for the insulating layer.

* * * * *